(12) United States Patent
Oh et al.

(10) Patent No.: US 11,907,460 B2
(45) Date of Patent: *Feb. 20, 2024

(54) TOUCH SENSING TYPE DISPLAY DEVICE

(71) Applicant: LG Display Co., Ltd., Seoul (KR)

(72) Inventors: Kum-Mi Oh, Paju-si (KR); Jin-Wuk Kim, Paju-si (KR); Sung-Hee Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/122,092

(22) Filed: Mar. 15, 2023

(65) Prior Publication Data

US 2023/0214041 A1 Jul. 6, 2023

Related U.S. Application Data

(63) Continuation of application No. 17/313,815, filed on May 6, 2021, now Pat. No. 11,620,009, which is a
(Continued)

(30) Foreign Application Priority Data

Mar. 19, 2010 (KR) ........................ 10-2010-0024914

(51) Int. Cl.
*G02F 1/1343* (2006.01)
*G02F 1/1333* (2006.01)
(Continued)

(52) U.S. Cl.
CPC ........ *G06F 3/0412* (2013.01); *G02F 1/13338* (2013.01); *G02F 1/133345* (2013.01);
(Continued)

(58) Field of Classification Search
CPC ............... G02F 1/1333; G02F 1/13338; G02F 1/133345; G02F 1/1335; G02F 1/133512;
(Continued)

(56) References Cited

U.S. PATENT DOCUMENTS

| | | | |
|---|---|---|---|
| 5,287,205 | A | 2/1994 | Yamazaki et al. |
| 8,125,460 | B2 | 2/2012 | Yang |

(Continued)

FOREIGN PATENT DOCUMENTS

| | | |
|---|---|---|
| CN | 101038385 | 9/2007 |
| CN | 101589473 A | 11/2009 |

(Continued)

OTHER PUBLICATIONS

Patent Translate KR 20070071798 (Jul. 4, 2007).*

*Primary Examiner* — Thoi V Duong
(74) *Attorney, Agent, or Firm* — Morgan, Lewis & Bockius LLP

(57) ABSTRACT

A touch sensing type liquid crystal display device includes an array substrate includes a first substrate, a common electrode, a pixel electrode, and a touch sensing unit; a color filter substrate including a second substrate and facing the array substrate; an anti-static layer on an outer side of the second substrate and including an organic material and a carbon nano-tube; and a liquid crystal layer between the first substrate and an inner side of the second substrate.

15 Claims, 10 Drawing Sheets

Related U.S. Application Data continuation of application No. 16/808,169, filed on Mar. 3, 2020, now Pat. No. 11,016,594, which is a continuation of application No. 15/640,008, filed on Jun. 30, 2017, now Pat. No. 10,620,729, which is a continuation of application No. 15/287,426, filed on Oct. 6, 2016, now Pat. No. 9,727,158, which is a continuation of application No. 13/051,000, filed on Mar. 18, 2011, now Pat. No. 9,600,109.

(51) Int. Cl.
| | | |
|---|---|---|
| *G02F 1/1335* | (2006.01) | |
| *G06F 3/041* | (2006.01) | |
| *G06F 3/044* | (2006.01) | |
| *H01L 27/12* | (2006.01) | |
| *G02F 1/1362* | (2006.01) | |
| *G06F 3/047* | (2006.01) | |
| *G02F 1/1368* | (2006.01) | |

(52) U.S. Cl.
CPC .. *G02F 1/134309* (2013.01); *G02F 1/134363* (2013.01); *G02F 1/136204* (2013.01); *G06F 3/047* (2013.01); *G06F 3/0445* (2019.05); *G06F 3/0446* (2019.05); *H01L 27/124* (2013.01); *G02F 1/1368* (2013.01); *G02F 1/133512* (2013.01); *G02F 1/133514* (2013.01); *G02F 1/134318* (2021.01); *G02F 1/134372* (2021.01); *G02F 1/136295* (2021.01); *G02F 2201/121* (2013.01); *G02F 2201/123* (2013.01); *G02F 2202/22* (2013.01)

(58) Field of Classification Search
CPC ............. G02F 1/133514; G02F 1/1343; G02F 1/134309; G02F 1/13439; G02F 1/134363; G02F 1/134372; G02F 1/134318; G02F 1/1362; G02F 1/136204; G02F 1/136295; G02F 1/1368; G02F 2201/121; G02F 2201/123; G02F 2202/22; G06F 3/044; G06F 3/0445; G06F 3/0446; G06F 3/047; G06F 2203/04103
See application file for complete search history.

(56) References Cited

U.S. PATENT DOCUMENTS

| | | | |
|---|---|---|---|
| 8,184,105 B2 | 5/2012 | Lin et al. | |
| 8,330,914 B2 | 12/2012 | Yoshihara | |
| 8,704,962 B2 | 4/2014 | Oh et al. | |
| 9,218,080 B2 | 2/2015 | Oh et al. | |
| 9,600,109 B2 | 3/2017 | Oh et al. | |
| 9,727,158 B2 | 8/2017 | Oh et al. | |
| 10,620,729 B2 | 4/2020 | Oh et al. | |
| 11,016,594 B2 | 5/2021 | Oh et al. | |
| 11,620,009 B2 * | 4/2023 | Oh | G06F 3/047 349/12 |
| 2002/0140365 A1 | 10/2002 | Kobayashi | |
| 2005/0256002 A1 | 12/2005 | Tajima | |
| 2006/0251844 A1 | 11/2006 | Choi et al. | |
| 2008/0143906 A1 | 6/2008 | Alllemand et al. | |
| 2008/0191715 A1 | 8/2008 | Schedlwy et al. | |
| 2008/0239214 A1 | 10/2008 | Lee et al. | |
| 2008/0246723 A1 | 10/2008 | Baumbach | |
| 2009/0051842 A1 | 2/2009 | Kim et al. | |
| 2009/0086146 A1 | 4/2009 | Wakabayashi | |
| 2009/0146945 A1 | 6/2009 | Cho | |
| 2009/0147167 A1 | 6/2009 | Park | |
| 2009/0179868 A1 | 7/2009 | Ayres et al. | |
| 2009/0256818 A1 | 10/2009 | Noguchi et al. | |
| 2009/0305055 A1 | 12/2009 | Shimizu | |
| 2010/0001973 A1 | 1/2010 | Hotelling et al. | |
| 2010/0085319 A1 | 4/2010 | Hayashi et al. | |
| 2010/0149126 A1 | 6/2010 | Futter | |
| 2010/0321327 A1 | 6/2010 | Liu | |
| 2010/0182273 A1 | 7/2010 | Noguchi et al. | |
| 2011/0157039 A1 | 6/2011 | Shin et al. | |
| 2011/0157504 A1 | 6/2011 | Kimura et al. | |
| 2011/0227850 A1 | 9/2011 | Oh et al. | |
| 2011/0228188 A1 | 9/2011 | Kim et al. | |
| 2011/0235230 A1 | 9/2011 | Lee et al. | |
| 2014/0375919 A1 | 12/2014 | Segawa et al. | |
| 2017/0300156 A1 | 10/2017 | Oh et al. | |

FOREIGN PATENT DOCUMENTS

| | | |
|---|---|---|
| JP | 2008-132605 A | 6/2008 |
| JP | 3154829 U | 10/2009 |
| KR | 10-2007-0011699 A | 1/2007 |
| KR | 10-2007-0044952 A | 5/2007 |
| KR | 10-2007-0071798 A | 7/2007 |
| KR | 10-0790216 B1 | 1/2008 |
| KR | 10-2010-0009472 A | 1/2010 |
| WO | 2009/119664 A1 | 10/2009 |

* cited by examiner

TOUCH SENSING TYPE DISPLAY DEVICE

This application is a continuation of co-pending U.S. patent application Ser. No. 17/313,815, filed May 6, 2021, which is a continuation of U.S. patent application Ser. No. 16/808,169, filed Mar. 3, 2020, now U.S. Pat. No. 11,016,594, which is a continuation of U.S. patent application Ser. No. 15/640,008, filed Jun. 30, 2017, now U.S. Pat. No. 10,620,729, which is a continuation of U.S. patent application Ser. No. 15/287,426, filed Oct. 6, 2016, now U.S. Pat. No. 9,727,158, which is a continuation of U.S. patent application Ser. No. 13/051,000, filed Mar. 18, 2011, now U.S. Pat. No. 9,600,109, which claims priority to Korean Patent Application No. 10-2010-0024914, filed on Mar. 19, 2010. All of the above prior U.S. and Korean patent applications are hereby incorporated by reference for all purposes as if fully set forth herein.

BACKGROUND OF THE INVENTION

Field of the Invention

The present invention relates to a liquid crystal display (LCD) device, and more particularly, to a touch sensing type liquid crystal display device including an anti-static layer and a method of fabricating the same.

Discussion of the Related Art

Recently, the LCD device has been widely used as a technology-intensive and value-added device of next generation due to its low power consumption and portability. In general, the LCD device uses the optical anisotropy and polarization properties of liquid crystal molecules to produce an image. Due to the optical anisotropy of the liquid crystal molecules, refraction of light incident onto the liquid crystal molecules depends upon the alignment direction of the liquid crystal molecules. The liquid crystal molecules have long thin shapes that can be aligned along specific directions. The alignment direction of the liquid crystal molecules can be controlled by applying an electric field. Accordingly, the alignment of the liquid crystal molecules changes in accordance with the direction of the applied electric field and the light is refracted along the alignment direction of the liquid crystal molecules due to the optical anisotropy, thereby images displayed.

Since the LCD device including a thin film transistor (TFT) as a switching element, referred to as an active matrix LCD (AM-LCD) device, has excellent characteristics of high resolution and displaying moving images, the AM-LCD device has been widely used.

The AM-LCD device includes an array substrate, a color filter substrate and a liquid crystal layer interposed therebetween. The array substrate may include a pixel electrode and the TFT, and the color filter substrate may include a color filter layer and a common electrode. The AM-LCD device is driven by an electric field between the pixel electrode and the common electrode to have excellent properties of transmittance and aperture ratio. However, since the AM-LCD device uses a vertical electric field, the AM-LCD device has a bad viewing angle.

An in-plane switching (IPS) mode LCD device or a fringe field switching (FFS) mode LCD device may be used to resolve the above-mentioned limitations. FIG. 1 is a cross-sectional view of an IPS mode LCD device according to the related art. As shown in FIG. 1, the array substrate and the color filter substrate are separated and face each other. The array substrate includes a first substrate 10, a common electrode 17 and a pixel electrode 30. Though not shown, the array substrate may include a TFT, a gate line, a data line, and so on. The color filter substrate includes a second substrate 9, a color filter layer (not shown), and so on. A liquid crystal layer 11 is interposed between the first substrate 10 and the second substrate 9. Since the common electrode 17 and the pixel electrode 30 are formed on the first substrate 10 on the same level, a horizontal electric field "L" is generated between the common and pixel electrodes 17 and 30. The liquid crystal molecules of the liquid crystal layer 11 are driven by a horizontal electric field such that the IPS mode LCD device has a wide viewing angle.

FIGS. 2A and 2B are cross-sectional views showing turned on/off conditions of an IPS mode LCD device according to the related art. As shown in FIG. 2A, when the voltage is applied to the IPS mode LCD device, liquid crystal molecules 11a above the common electrode 17 and the pixel electrode 30 are unchanged. But, liquid crystal molecules 11b between the common electrode 17 and the pixel electrode 30 are horizontally arranged due to the horizontal electric field "L". Since the liquid crystal molecules are arranged by the horizontal electric field, the IPS mode LCD device has a characteristic of a wide viewing angle. FIG. 2B shows a condition when the voltage is not applied to the IPS mode LCD device. Because an electric field is not generated between the common and pixel electrodes 17 and 30, the arrangement of liquid crystal molecules 11 is not changed.

In the FFS mode LCD device, one of the pixel electrode and the common electrode has a plate shape in the pixel region, and the other one of the pixel electrode and the common electrode has an opening. The pixel and common electrode are formed on a lower substrate. As a result, liquid crystal molecules are driven by a fringe field between the pixel and common electrodes.

Unfortunately, since there is no the common electrode, which is formed of a conductive material, on an upper substrate in the IPS mode LCD device or the FFS mode LCD device, an anti-static layer, which is formed of a transparent conductive material such as indium-tin-oxide (ITO) and indium-zinc-oxide (IZO), is required on an outer side of the upper substrate to prevent problems resulting from a static electricity. Generally, the anti-static layer has a thickness of about 200 angstroms (Å) and a sheet resistance of about 500 ohms per square ($\Omega$/sq). Since the sheet resistance of the anti-static layer is substantially same as that of a metallic material, there is no damage on the device from the static electricity due to the anti-static layer.

The IPS mode LCD device or the FFS mode LCD device are used for a television, a projector, a mobile phone, a PDA, and so on. Recently, mobile devices include a touch sensor such that the device can be operated by touching.

Unfortunately, even if a capacitive overlay type touch sensor is included in the cell of the IPS mode LCD device or the FFS mode LCD device, a change of capacitance generated by a touch can not be detected because of the anti-static layer, which is formed of the transparent conductive material such as indium-tin-oxide (ITO) and indium-zinc-oxide (IZO), of the IPS mode LCD device or the FFS mode LCD device. Namely, the related art IPS mode LCD device or the FFS mode LCD device can not be operated by a touch sensor.

In more detail, when the user touches his finger onto the IPS mode LCD device or the FFS mode LCD device, the capacitance is generated between the finger and the anti-static layer of the IPS mode LCD device or the FFS mode LCD device. The capacitance is discharged into an outer space through the anti-static layer such that the touch of the user can not be detected by the capacitive overlay type touch sensor. If the anti-static layer is removed for the touch sensing, there are damages by the static electricity.

SUMMARY OF THE INVENTION

Accordingly, the present invention is directed to a touch sensing type LCD device and a method of fabrication the same that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a touch sensing type liquid crystal display device includes an array substrate including a first substrate, a common electrode, a pixel electrode, and a touch sensing unit; a color filter substrate including a second substrate and facing the array substrate; an anti-static layer on an outer side of the second substrate and including an organic material and a carbon nano-tube; and a liquid crystal layer between the first substrate and an inner side of the second substrate.

In another aspect of the present invention, a method of fabricating a touch sensing type liquid crystal display device includes forming a gate line, a data line, a thin film transistor, a common electrode, a pixel electrode and a touch sensing unit on a first substrate; forming an anti-static layer on an outer side of a second substrate, the anti-static layer including an organic material and a carbon nano-tube; and attaching the first and second substrates with a liquid crystal layer interposed between the first and second substrates.

In another aspect of the present invention, a method of fabricating a touch sensing type liquid crystal display device includes forming a gate line, a data line, a thin film transistor, a common electrode, a pixel electrode and a touch sensing unit on a first substrate; attaching a second substrate to the first substrate to form a liquid crystal panel, wherein the liquid crystal panel has a first thickness; etching an outer side of each of the first and second substrates such that the liquid crystal panel has a second thickness smaller than the first thickness; and forming an anti-static layer on the outer side of the second substrate, the anti-static layer including an organic material and a carbon nano-tube.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments, examples of which are illustrated in the accompanying drawings.

Figure 1:
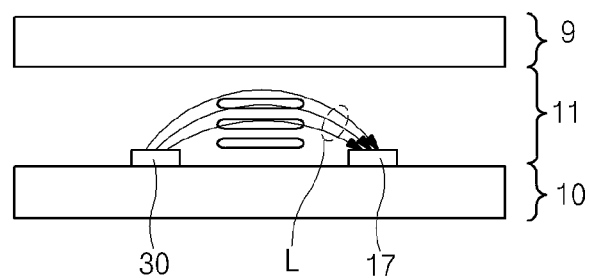
FIG. 1 is a cross-sectional view of an IPS mode LCD device according to the related art.
Figure 2A:
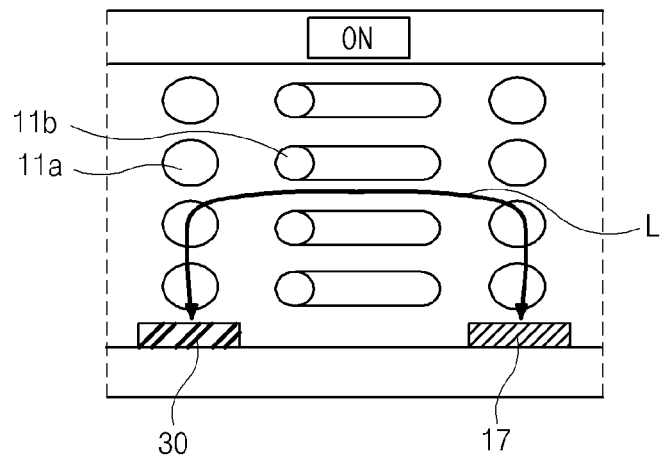
FIGS. 2A and 2B are cross-sectional views showing turned on/off conditions of an IPS mode LCD device according to the related art.
Figure 2B:
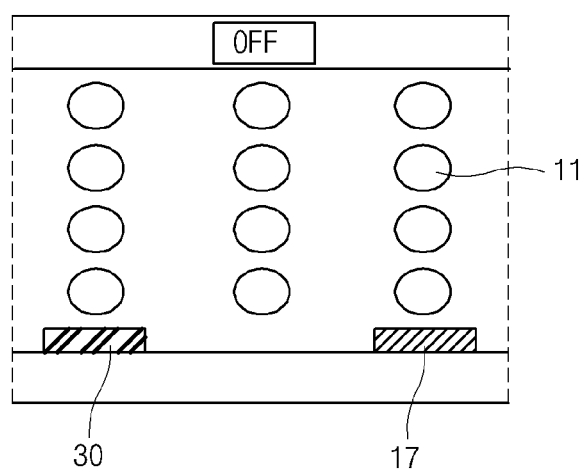
Figure 3:
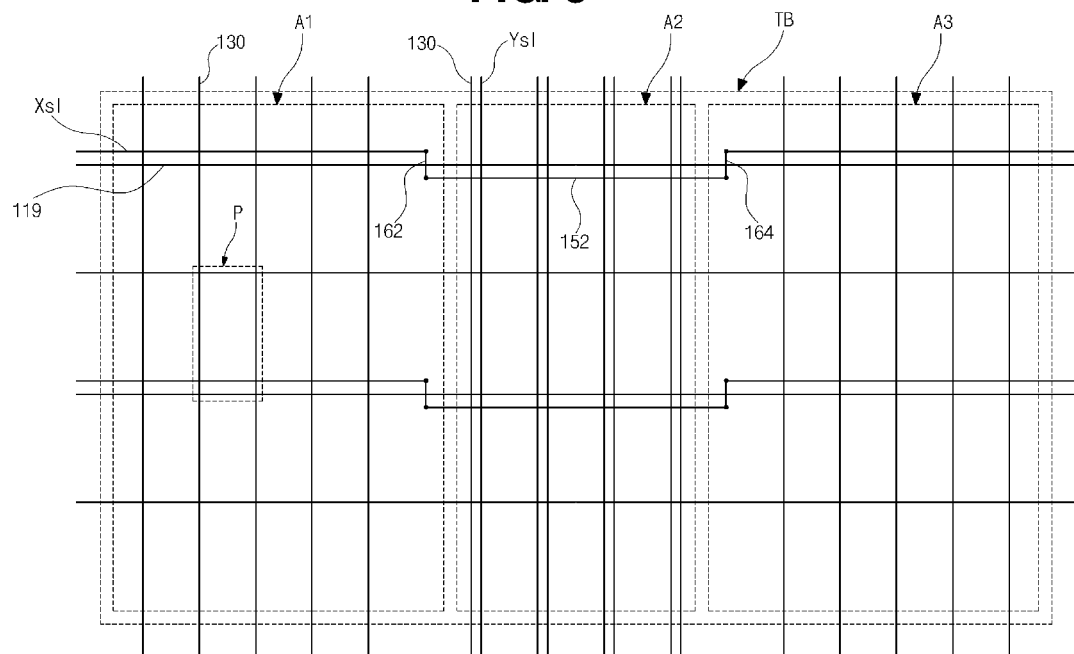
FIG. 3 is a schematic plane-view of an array substrate for a touch sensing type LCD device according to the present invention.

FIG. 3 is a schematic plane-view of an array substrate for a touch sensing type LCD device according to the present invention.

As shown in FIG. 3, a plurality of touch blocks TB are defined on an array substrate. In addition, first to third regions A1, A2 and A3 are defined in each touch block TB. The second region A2 is disposed between the first and third regions A1 and A3. The touch block TB is a unit region of touch sensing. A plurality of pixel regions P are defined in each of the first to third regions A1, A2 and A3.

A plurality of gate lines 119 extends along a first direction, i.e., an X direction, and a plurality of data lines 130 extends along a second direction, i.e., a Y direction. The gate lines 119 and the data lines 130 cross each other to define the pixel regions P.

In addition, an X direction sensing line Xsl extends along the first direction through the first region A1 and the third region A3. The X direction sensing line Xsl is disposed over the gate line 119. Namely, the X direction sensing line Xsl overlaps the gate line 119. The X direction sensing lines Xsl in the first and third regions A1 and A3 in one touch block TB is electrically connected to a connection line 152 in the second region A2. The connection line 152 extends along the gate line 119 and is spaced apart from the gate line 119 to avoid an electrical short. The connection line 152 may be formed of the same material and disposed at the same layer as the gate line 119. One end of the connection line 152 is connected to the X direction sensing line Xsl in the first region A1 through a first connection pattern 162, and the other end of the connection line 152 is connected to the X direction sensing line Xsl in the third region A3 through a second connection pattern 164.

A Y direction sensing line Ysl extends along the second direction through the second region A2. The Y direction sensing line Ysl is disposed over the data line 130. Namely, the Y direction sensing line Ysl overlaps the data line 130. Since the Y direction sensing line Ysl is disposed at a different layer than the connection line 152, there is no electrical short.

Although not shown, a common electrode having a plate shape and a pixel electrode having an opening are formed with an insulating layer therebetween. The pixel electrode in one pixel region is separated from that in another pixel region. The common electrode in one touch block TB is separated from that in another touch block TB. In addition, the common electrodes the first to third areas A1, A2 and A3 are separated from one another. An X direction sensing circuit is disposed at one end of the X direction sensing line Xsl, and a Y direction sensing circuit is disposed at one end of the Y direction sensing line Ysl. The X direction sensing circuit and the Y direction sensing circuit are positioned at a non-display area at periphery of a display area including the touch blocks TB.

When one touch block TB is touched, a change of capacitance between the pixel and common electrode are detected by the X direction sensing circuit and the Y direction sensing circuit through the X direction sending line Xsl and the Y direction sensing line Ysl, respectively. As a result, a position of the touched touch block TB is sensed.

Figure 4:
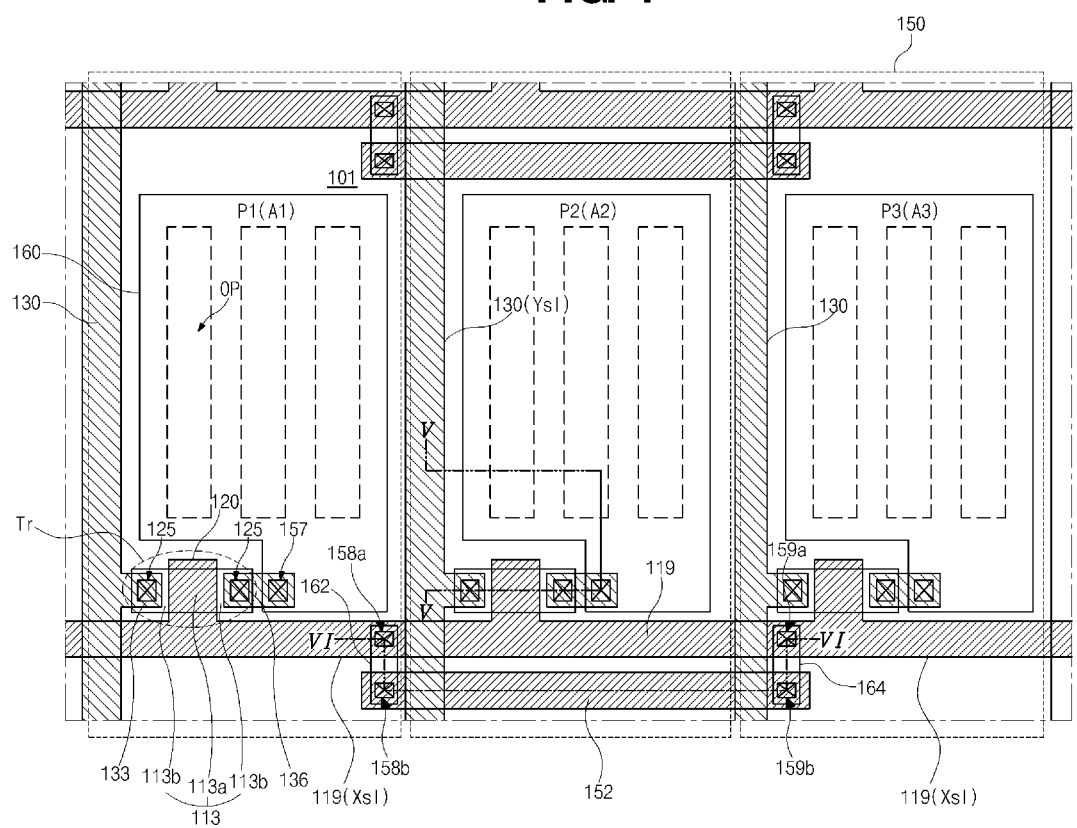
FIG. 4 is a plane-view showing a part of an array substrate for a touch sensing type LCD device according to the present invention.
Figure 5:
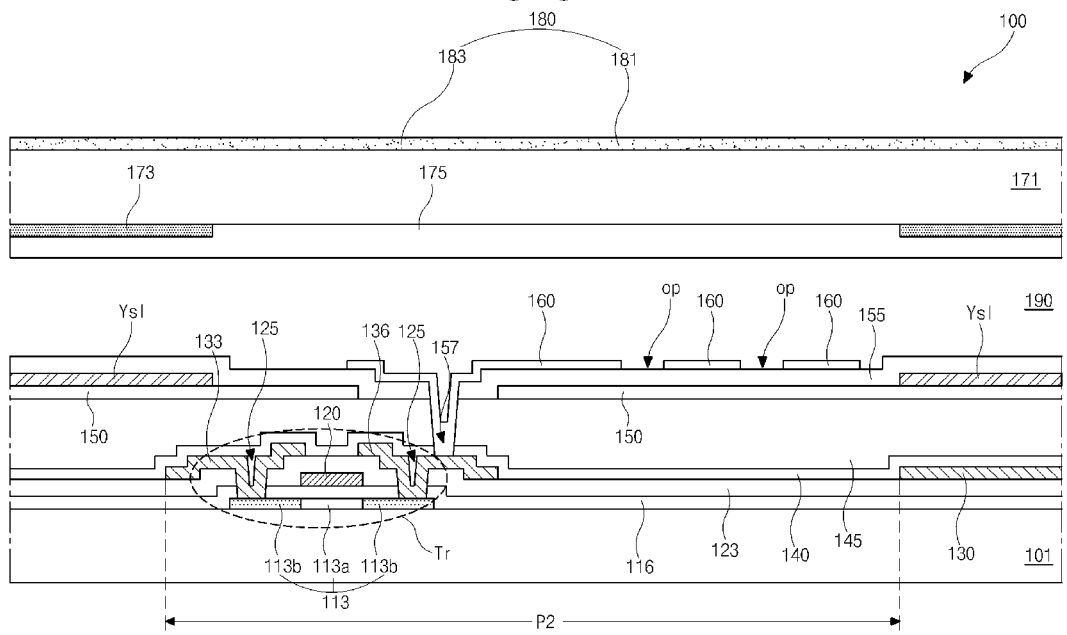
FIG. 5 is a cross-sectional view taken along the line V-V of FIG. 4.
Figure 6:
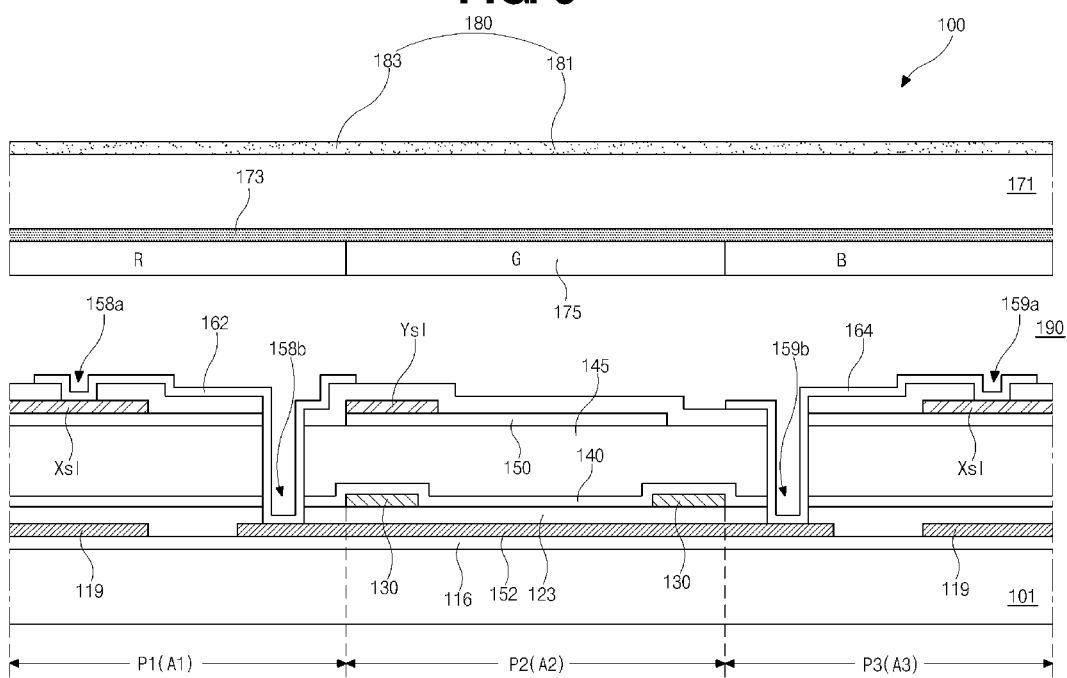
FIG. 6 is a cross-sectional view taken along the line VI-VI of FIG. 4.

FIG. 4 is a plane-view showing a part of an array substrate for a touch sensing type LCD device according to the present invention. FIG. 5 is a cross-sectional view taken along the line V-V of FIG. 4, and FIG. 6 is a cross-sectional view taken along the line VI-VI of FIG. 4. FIG. 4 shows first to third regions each including one pixel region. However, as shown in FIG. 3, each of the first to third regions may have at least one pixel region.

As shown in FIGS. 4 to 6, a gate line 119 and a data line 130 are formed on a first substrate 101. The gate and data lines 119 and 130 cross each other to define first to third pixel regions P1, P2 and P3. The first to third pixel regions P1, P2, P3 are respectively included to the first to third regions A1, A2 and A3.

In each pixel region P, a thin film transistor (TFT) Tr including a semiconductor layer 113, a gate electrode 120, a source electrode 133 and a drain electrode 136 is formed. The gate electrode 120 and the source electrode 133 respectively extend from the gate line 119 and the data line 130 such that the TFT Tr is electrically connected to the gate line 119 and the data line 130.

The semiconductor layer 113 is formed of polycrystalline silicon. A first semiconductor region 113a of a center of the semiconductor layer 113, which is formed of intrinsic polycrystalline silicon, serves as a channel, and second semiconductor regions 113b at both sides of the first semiconductor region 113a are doped by high-concentration impurities. A gate insulating layer 116 is formed on the semiconductor layer 113.

The gate electrode 120 is formed on the gate insulating layer 116 and corresponding to the first semiconductor region 113a. The gate line 119 is formed on the gate insulating layer 116 and connected to the gate electrode 120. A connection line 152 is also formed on the gate insulating layer 116 and parallel to the gate line 119. The connection line 152 is spaced apart from the gate line. The connection line 152 is disposed in the second pixel region P2 of the second region A2, and both ends of the connection line 152 are respectively disposed in the first pixel region P1 of the first region A1 and the third pixel region P3 of the third region A3.

An interlayer insulating layer 123 is formed on the gate line 119, the gate electrode 120 and the connection line 152. For example, the interlayer insulating layer 123 may be formed of an inorganic insulating material, for example, silicon oxide or silicon nitride. The interlayer insulating layer 123 and the gate insulating layer 116 are patterned to form semiconductor contact holes 125 exposing the second semiconductor regions 113b of the semiconductor layer 113.

On the interlayer insulating layer 123, the data line 130 is formed to cross the gate line 119. In addition, the source electrode 133 and the drain electrode 136 are formed on the interlayer insulating layer 123. The source and drain electrodes 133 and 136 respectively contact the second semiconductor regions 113b through the semiconductor contact holes 125.

As mentioned above, the semiconductor layer 113, the gate insulating layer 116, the gate electrode 120, the interlayer insulating layer 123, the source electrode 133 and the drain electrode 136 constitute the TFT Tr. This may be referred to as a top gate type TFT. Alternatively, a bottom gate type TFT, where a semiconductor layer is positioned between a gate electrode as a lower layer of the TFT and source and drain electrodes as a upper layer of the TFT, may be used.

A first passivation layer 140, which is formed of an inorganic insulating material, for example, silicon oxide or silicon nitride, and a second passivation layer 145, which is formed of an organic insulating material, for example, photo-acryl or benzocyclobutene (BCB), are stacked on the data line 130, the source electrode 133 and the drain electrode 136. The second passivation layer 145 may have a thickness about 2 to 4 micrometers to provide a flat top surface. Since an adhesive strength between a metallic material of the data line 130 and the organic insulating material of the second passivation layer 145 is smaller than an adhesive strength between a metallic material of the data line 130 and the inorganic insulating material of the first passivation layer 140 and between the inorganic insulating material of the first passivation layer 140 and the organic insulating material of the second passivation layer 145, an adhesive property between the metallic material of the data line 130 and the organic insulating material of the second passivation layer 145 is improved due to the first passivation layer 140. The first passivation layer 140 may be omitted.

A common electrode 150, which has an island shape in each of the first to third regions A1, A2 and A3, is formed on the second passivation layer 145. Namely, the common electrode 150 in the second region A2 is separated from that in each of the first and third regions A1 and A3. The common electrode 150 has a plate shape. The common electrode 150 is formed of a transparent conductive material, for example, indium-tin-oxide (ITO) or indium-zinc-oxide (IZO).

An X direction sensing line Xsl and a Y direction sensing line Ysl are formed on the common electrode 150. The X direction sensing line Xsl overlaps the gate line 119 in the first and third regions A1 and A3, and the Y direction sensing line Ysl overlaps the data line 130 in the second region A2. The Y direction sensing line Ysl extends along the data line 130 such that the second regions A2 arranged along the data line 130 are electrically connected by the Y direction sensing line Ysl. The X direction sensing lines Xsl in the first and third regions A1 and A2 of each touch block TB (of FIG. 3) are electrically connected to each other through the connection line 152.

A third passivation layer 155 is formed on the X direction sensing line Xsl and the Y direction sensing line Ysl. The third passivation layer 155 may be formed of an inorganic insulating material, for example, silicon oxide or silicon nitride.

The first to third passivation layers 140, 145 and 155 are patterned to form a drain contact hole 157 exposing the drain electrode 136. In addition, the third passivation layer 155 is patterned to form first and second contact holes 158a and 159a respectively exposing the X sensing lines Xsl in the first and third regions A1 and A3. Furthermore, the first to third passivation layer 140, 145 and 155 and the interlayer insulating layer 123 are patterned to form third and fourth contact holes 158b and 159b respectively exposing ends of the connection line 152.

A pixel electrode 160 is formed on the third passivation layer 155. The pixel electrode 160 is disposed in each pixel region P and contacts the drain electrode 136 through the drain contact hole 157. The pixel electrode 160 is formed of a transparent conductive material, for example, ITO or IZO. The pixel electrode 160 has at least one opening op, which corresponds to the common electrode 150, such that a fringe field is generated between the pixel and common electrodes 160 and 150. The third passivation layer 155 is interposed between the pixel and common electrodes 160 and 150 such that a storage capacitor is formed.

In addition, first and second connection patterns 162 and 164 are formed on the third passivation layer 155. One end of the first connection pattern 162 contacts the X direction sensing line Xsl in the first region A1 through the first contact hole 158a, and the other end of the first connection pattern 162 contacts the connection line 152 through the third contact hole 158b. One end of the second connection pattern 164 contacts the X direction sensing line Xsl in the third region A3 through the second contact hole 159a, and the other end of the second connection pattern 164 contacts the connection line 152 through the fourth contact hole 159b. As a result, the X direction sensing line Xsl in the first region A1 is electrically connected to the X direction sensing line Xsl in the third region A3.

A second substrate 171 faces the first substrate 101. A black matrix 173 is formed on an inner side of the second substrate 171. The black matrix 173 corresponds to boundaries of the pixel region P and has a lattice shape. The black matrix 173 may further correspond to the TFT Tr. A color filter 175 is formed on the inner side of the second substrate 171 and corresponds to the pixel region P. The color filter 175 may include red, green and blue color filters.

In addition, an anti-static layer 180 is formed on an outer side of the second substrate 171. The anti-static layer 180 includes a base layer 181 of an organic material and a carbon nano-tube 183 in the base layer 181. The carbon nano-tube 183 has a conductive property. The anti-static layer 180 has a sheet resistance of about $10^6$ to $10^9$ ohms per square ($\Omega$/sq). For example, the organic material for the base layer 181 may include polymethyl methacrylate (PMMA) or polyethylene terephthalate (PET) such that a sheet resistance of the base layer 181 has a range within about $10^{14}$ to $10^{20}$ ohms per square ($\Omega$/sq). When only the base layer 181 is formed on the outer side of the second substrate 171, the base layer 181 can not serves as an anti-static layer because the sheet resistance of the base layer 181 is too high. Accordingly, there are strong damages on the device by a static electricity.

However, since the carbon nano-tube 183 is formed with the base layer 181 on the outer side of the second substrate 171, the layer 180 has an anti-static property. Namely, since the anti-static layer 180 has a sheet resistance of about $10^6$ to $10^9$ ohms per square ($\Omega$/sq), there is no damage on the device from a static electricity.

By providing a liquid crystal layer 190 between the first and second substrates 101 and 171 and a seal pattern (not shown) at edges of one of the first and second substrates 101 and 171, the touch sensing type FFS mode LCD device is obtained. An FFS mode LCD device, which includes the common electrode having a plate shape and the pixel electrode having an opening, is show by FIGS. 3 to 6. Alternatively, an IPS mode LCD device, which includes the common and pixel electrodes being alternately arranged with each other, is also available.

As mentioned above, the touch sensing type LCD device includes the anti-static layer 180, which includes the base layer 181 and the carbon nano-tube to have a sheet resistance of about $10^6$ to $10^9$ ohms per square ($\Omega$/sq), at an outer side of the second substrate 171. The anti-static layer 180 serves as a path for a static electricity and does not serve as an obstructer for touch sensing. Namely, the anti-static layer 180 serves as a dielectric layer between a finger and the common electrode 150 when the device is touched such that a capacitor is formed between the finger and the common electrode 150. As a result, a touch is detected by a change of capacitance between the finger and the common electrode 150.

In more detail, when one touch block TB (of FIG. 3) is touched, the anti-static layer 180, which has a sheet resistance of about $10^6$ to $10^9$ ohms per square ($\Omega$/sq), serves as a dielectric layer such that a capacitor is generated by the finger, the common electrode 150, the liquid crystal layer 190, the color filter layer 175, the second substrate 171, the anti-static layer 180, and so on. A change of capacitance of the capacitor is detected by the X direction sensing circuit (not shown) and the Y direction sensing circuit (not shown) through the X direction sensing line Xsl and the Y direction sensing line Ysl, which are respectively connected to the common electrode 150, such that a position of the touched touch block TB is sensed.

Since the static electricity has a voltage of several thousands to several hundreds of thousands, the anti-static layer 180, which has a sheet resistance of about $10^6$ to $10^9$ ohms per square ($\Omega$/sq), serves as a conductive path for the static electricity. However, since an electric current of the finger has a range within several nano-amperes to several micro-amperes, the anti-static layer 180, which has a sheet resistance of about $10^6$ to $10^9$ ohms per square ($\Omega$/sq), serves as an insulating layer for the touch. Accordingly, the anti-static layer 180 serves as a dielectric layer of the capacitor for the touch. As a result, the device according to the present invention including a touch sensing part, i.e., the X direction sensing line Xsl and the Y direction sensing line Ysl, and the anti-static layer 180 can be operated by a touch sensing, and there is no damage from a static electricity.

FIGS. 7A to 7E are cross-sectional view showing a fabricating process of a touch sensing type LCD device according to an embodiment of the present invention.

Figure 7A:
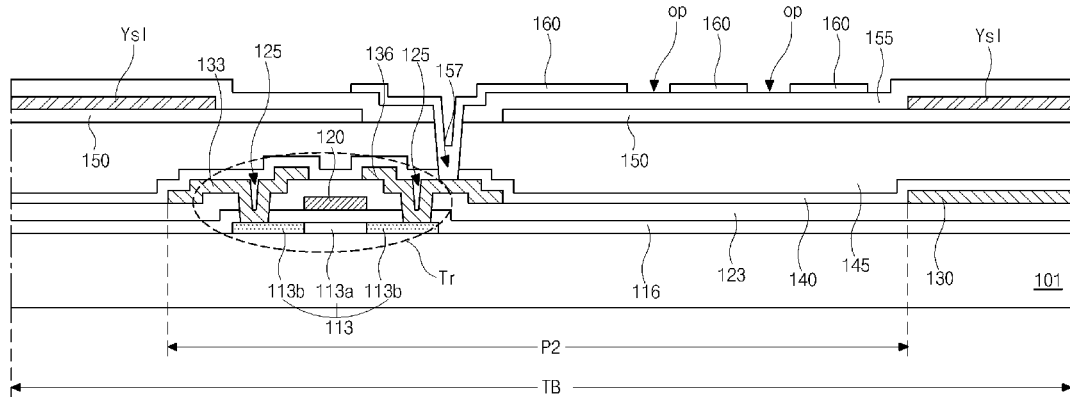
FIGS. 7A to 7E are cross-sectional view showing a fabricating process of a touch sensing type LCD device according to an embodiment of the present invention.

As shown in FIG. 7A, an array substrate is formed by following processes. An intrinsic amorphous silicon layer (not shown) is formed on the first substrate 101 by depositing intrinsic amorphous silicon. The amorphous silicon layer is crystallized by irradiating a laser beam or heating to form a polycrystalline silicon layer (not shown). The polycrystalline silicon layer is patterned by a mask process to form the semiconductor layer 113 in each pixel regions P1, P2 and P3. FIGS. 7A to 7E show the second pixel region P2 of the second region A2 (of FIG. 3) in one touch block TB.

Next, the gate insulating layer 116 is formed on the semiconductor layer 113 by depositing an inorganic insulating material such as silicon oxide and silicon nitride.

Next, a first metal layer (not shown) is formed on the gate insulating layer 116 by depositing one of aluminum (Al), Al alloy (AlNd), copper (Cu), Cu alloy and chromium (Cr). The first metal layer is patterned to form the gate electrode 120, the gate line 119 (of FIG. 4) and the connection line 152 (of FIG. 4). The gate electrode 120 corresponds to a center of the semiconductor layer 113 and extends from the gate line 119. The connection line 152 is spaced apart from and parallel to the gate line 119. The connection line 152 is disposed in the second region A2, and both ends of the connection line 152 protrude to the first and third regions A1 and A3 (of FIG. 3 or FIG. 4).

Next, impurities are doped into the semiconductor layer 113 using the gate electrode 120 as a blocking such that the impurities are doped into both sides of the semiconductor layer 113. As a result, a first semiconductor region 113a of a center of the semiconductor layer 113, which is formed of intrinsic polycrystalline silicon, serves as a channel, and second semiconductor regions 113b at both sides of the first semiconductor region 113a are doped by high-concentration impurities.

Next, the interlayer insulating layer 123 is formed on the gate line 119, the gate electrode 120 and the connection line 152 by depositing an inorganic insulating material, for example, silicon oxide or silicon nitride. The interlayer insulating layer 123 and the gate insulating layer 116 are patterned to form the semiconductor contact holes 125 exposing the second semiconductor regions 113b of the semiconductor layer 113.

Next, a second metal layer (not shown) is formed on the interlayer insulating layer 123 by depositing one of aluminum (Al), Al alloy (AlNd), copper (Cu), Cu alloy, chromium (Cr), and molybdenum (Mo). The second metal layer is patterned to form the data line 130, the source electrode 133 and the drain electrode 136. The source and drain electrodes 133 and 136 respectively contact the second semiconductor regions 113b through the semiconductor contact holes 125. The drain electrode 136 is spaced apart from the source electrode 133. The data line 130 extends from the source electrode 133 and crosses the gate line 119 to define the pixel regions P1, P2 and P3.

The semiconductor layer 113, the gate insulating layer 116, the gate electrode 120, the interlayer insulating layer 123, the source electrode 133 and the drain electrode 136 constitute the TFT Tr. This may be referred to as a top gate type TFT. Alternatively, a bottom gate type TFT, where a semiconductor layer is positioned between a gate electrode as a lower layer of the TFT and source and drain electrodes as a upper layer of the TFT, may be used. To form the bottom gate type TFT, a step of forming the gate electrode, the gate line and the connection line, a step of forming the gate insulating layer, a step of forming a semiconductor layer, which includes an active layer of intrinsic amorphous silicon and an ohmic contact layer of impurity-doped amorphous silicon, and a step of forming the data line, the source electrode and the drain electrode are sequentially processed.

Next, a first passivation layer 140 and a second passivation layer 145 are sequentially formed on the TFT Tr and the data line 130 by depositing an inorganic insulating material and coating an organic insulating material. The second passivation layer 145 has a flat top surface. The first passivation layer 140 for enhancing an adhesive property between a metallic material of the data line and the organic insulating material of the second passivation layer 145 may be omitted.

Next, a first transparent conductive material layer (not shown) is formed on the second passivation layer 145 by depositing a transparent conductive material, for example, ITO or IZO. The first transparent conductive material layer is patterned to form the common electrode 150. As mentioned above, the common electrode 150 has an island shape in each of the first to third regions A1, A2 and A3. Namely, the common electrode 150 in the second region A2 is separated from that in each of the first and third regions A1 and A3.

Next, a third metal layer (not shown) is formed on the common electrode 150 by depositing one of aluminum (Al), Al alloy (AlNd), copper (Cu) and Cu alloy. The third metal layer is patterned to form the X direction sensing line Xsl (of FIG. 4) and the Y direction sensing line Ysl. The X direction sensing line Xsl overlaps the gate line 119 in the first and third regions A1 and A3, and the Y direction sensing line Ysl overlaps the data line 130 in the second region A2. The Y direction sensing line Ysl extends along the data line 130 such that the second regions A2 arranged along the data line 130 are electrically connected by the Y direction sensing line Ysl. The X direction sensing lines Xsl in the first and third regions A1 and A2 of each touch block TB (of FIG. 3) are electrically connected to each other through the connection line 152.

Next, a third passivation layer 155 is formed on the X direction sensing line Xsl and the Y direction sensing line by depositing an inorganic insulating material, for example, silicon oxide or silicon nitride. The third passivation layer 155 is patterned to form first and second contact holes 158a and 159a respectively exposing the X sensing lines Xsl in the first and third regions A1 and A3. The first to third passivation layers 140, 145 and 155 are patterned to form a drain contact hole 157 exposing the drain electrode 136. The first to third passivation layer 140, 145 and 155 and the interlayer insulating layer 123 are patterned to form third and fourth contact holes 158b and 159b respectively exposing ends of the connection line 152.

Next, a second transparent conductive material layer (not shown) is formed on the third passivation layer 145 by depositing a transparent conductive material, for example, ITO or IZO. The second transparent conductive material layer is patterned to form the pixel electrode 160, and the first and second connection patterns 162 and 164. The pixel electrode 160 is disposed in each pixel region P and contacts the drain electrode 136 through the drain contact hole 157. The pixel electrode 160 has at least one opening op, which corresponds to the common electrode 150, such that a fringe field is generated between the pixel and common electrodes 160 and 150. One end of the first connection pattern 162 contacts the X direction sensing line Xsl in the first region A1 through the first contact hole 158a, and the other end of the first connection pattern 162 contacts the connection line 152 through the third contact hole 158b. One end of the second connection pattern 164 contacts the X direction sensing line Xsl in the third region A3 through the second contact hole 159a, and the other end of the second connection pattern 164 contacts the connection line 152 through the fourth contact hole 159b. As a result, the X direction sensing line Xsl in the first region A1 is electrically connected to the X direction sensing line Xsl in the third region A3.

Figure 7B:
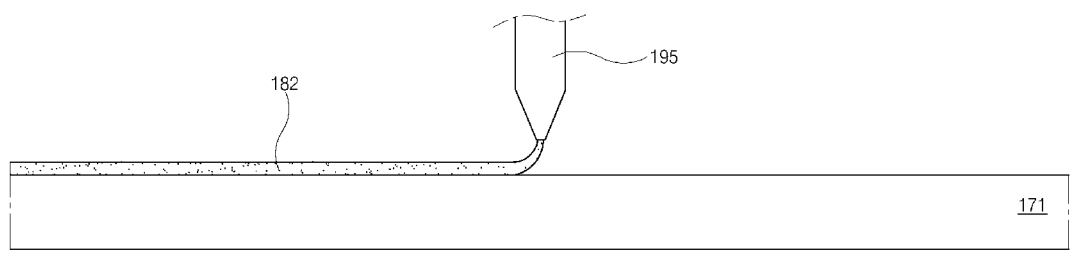

Next, as shown in FIG. 7B, a liquid phase organic mixture including a solution, which includes an organic material such as PMMA and PET with an organic solvent, and a carbon nano-tube is coated on an outer side of the second substrate 171 under a room temperature by a spin coating apparatus (not shown) or a slit coating apparatus (not shown) to form an organic solution layer 182. The organic material is inserted into the organic solvent to form the solution, and the power-type carbon nano-tube is inserted into the solution. The resulting solution is mixed to form liquid phase organic mixture.

Figure 7C:
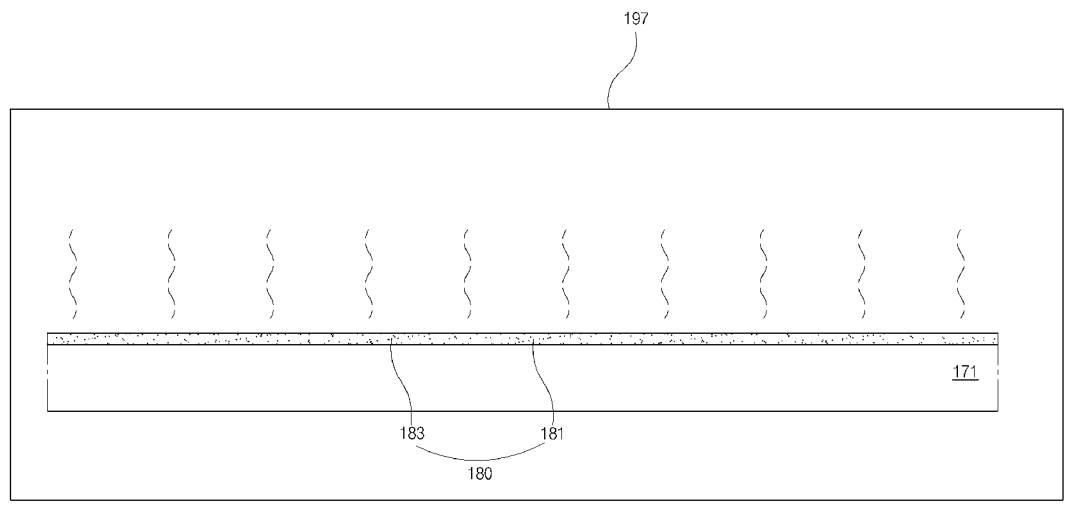

Next, as shown in FIG. 7C, the organic solution layer 182 (of FIG. 7C) including the carbon nano-tube is dried by heating in a furnace or oven 197 to volatilize and remove the organic solvent. As a result, the anti-static layer 180 including the base layer 181 of the organic material and the carbon nano-tube 183 is formed on the outer side of the second substrate 171. As mentioned above, the anti-static layer 180 has a sheet resistance of about $10^6$ to $10^9$ ohms per square ($\Omega$/sq). For example, the anti-static layer 180 has a thickness of about 300 to 1000 angstroms. The sheet resistance of the anti-static layer 180 is controlled depending on a relative weight % of the carbon nano-tube with respect to the organic material.

Figure 7D:
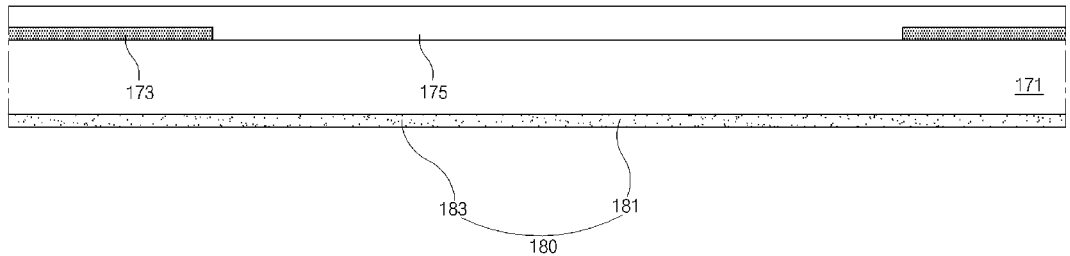

Next, as shown in FIG. 7D, a light blocking material, for example, a black resin, is coated on an inner side of the second substrate 171 and patterned by a mask process to form the black matrix 173. Next, the color filter 175 including the red, green and blue color filters is formed on the inner side of the second substrate 171. As a result, a color filter substrate is obtained. Although not shown, an overcoat layer for providing a flat top surface may be formed.

Figure 7E:
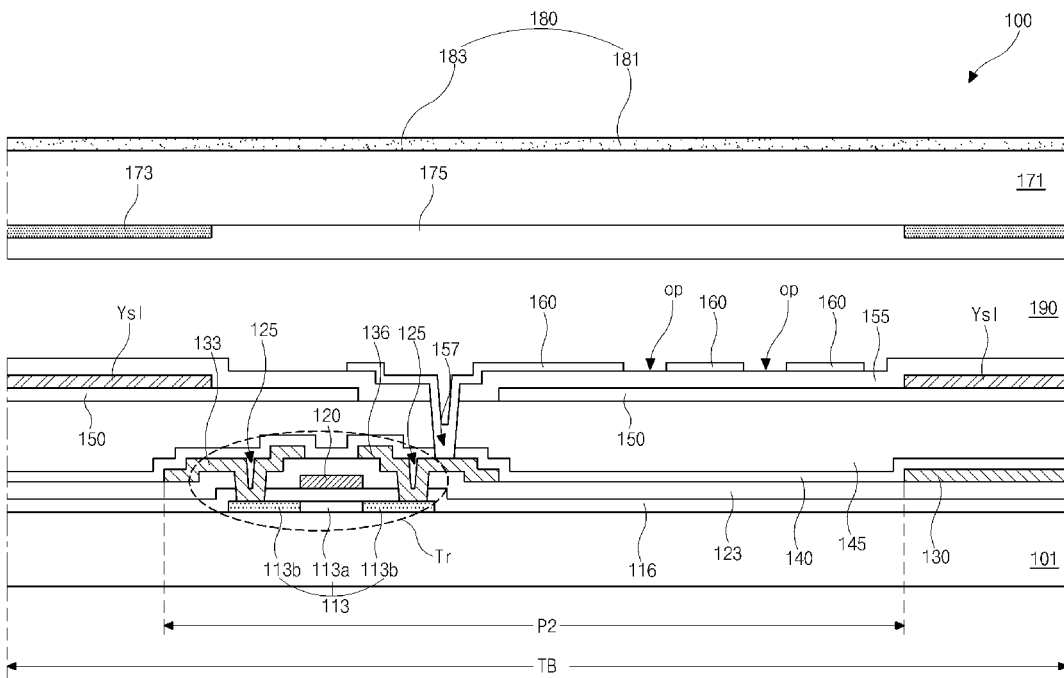

Next, as shown in FIG. 7E, the array substrate and the color filter substrate are disposed such that the color filter layer 175 faces the pixel electrode 160, and a seal pattern (not shown) is formed along edges of one of the array substrate and the color filter substrate. Next, the liquid crystal layer 190 is disposed between the array substrate and the color filter substrate, and the array substrate and the color filter substrate are attached to form a liquid crystal panel.

Although not shown, the X direction sensing circuit and the Y direction sensing circuit, which are respectively connected to the X direction sensing line and the Y direction sensing line, and a driving circuit connected to the gate line 119 and the data line 130 are formed on the liquid crystal panel to obtain the device 100.

FIGS. 8A to 8F are cross-sectional view showing a fabricating process of a touch sensing type LCD device according to an embodiment of the present invention.

The process shown by FIGS. 8A to 8F has difference in a step of forming the anti-static layer and a step of etching the first and second substrates. Accordingly, below explanation is focused on the differences.

Figure 8A:
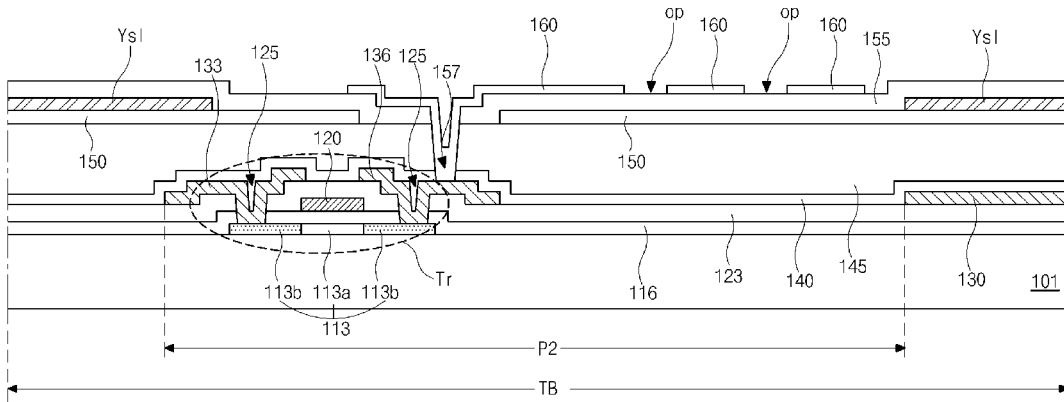
FIGS. 8A to 8F are cross-sectional view showing a fabricating process of a touch sensing type LCD device according to an embodiment of the present invention.

As shown in FIG. 8A, the array substrate is obtained by forming the TFT Tr, the gate line 119, the data line 130, the X direction sensing line Xsl, the Y direction sensing line Ysl, the common electrode 150, the pixel electrode 160, the connection line 152, the connection patterns 162 and 164, and so on.

Figure 8B:
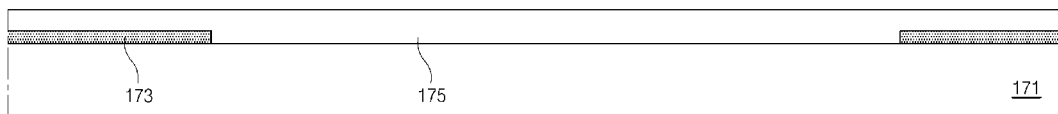

Next, as shown in FIG. 8B, the black matrix 173 and the color filter layer 175 are formed on an inner side of the second substrate 171.

Figure 8C:
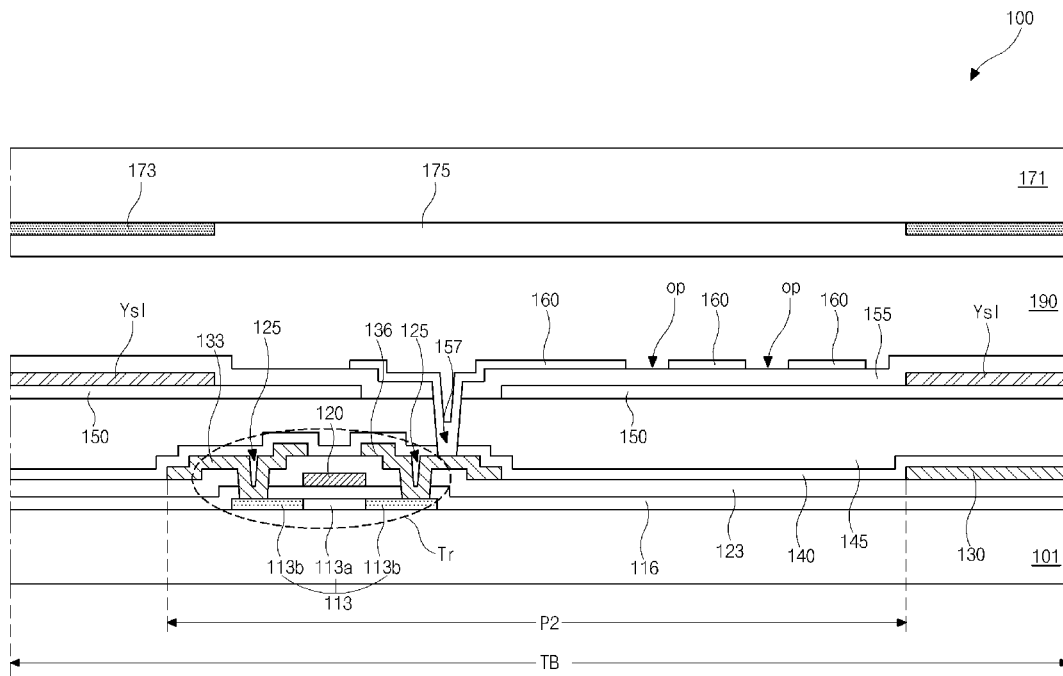

Next, as shown in FIG. 8C, the first substrate 101 and the second substrate 171 are disposed such that the color filter layer 175 faces the pixel electrode 160, and a seal pattern (not shown) is formed along edges of one of the first substrate 101 and the second substrate 171. Next, the liquid crystal layer 190 is disposed between the first substrate 101 and the second substrate 171, and first substrate 101 and the second substrate 171 are attached to form a liquid crystal panel.

Figures 8D, 8E:
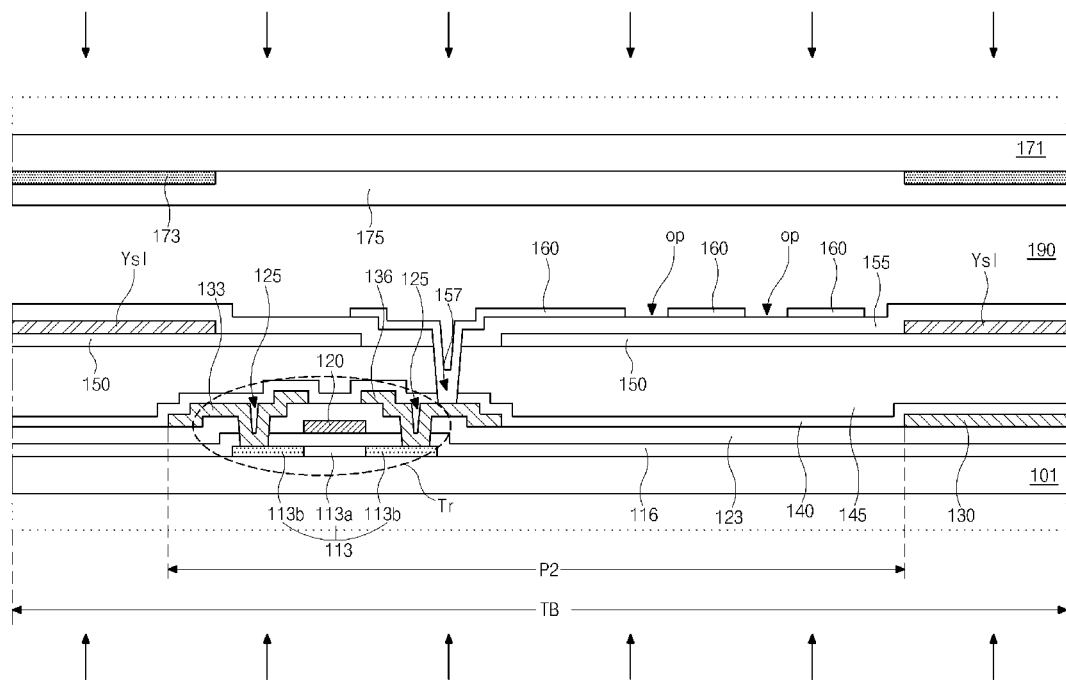

Next, as shown in FIG. 8D, the liquid crystal panel is exposed to an etchant, which is capable of etching glass of the first and second substrates 101 and 171, to reduce a thickness of each of the first and second substrates 101 and 171. Namely, a thickness of liquid crystal panel is reduced. For example, the etchant may include hydrofluoric acid (HF). A dipping process or a spray process may be used. As a result, light weight and thin profile LCD device can be obtained.

When the thickness of the first and second substrates 101 and 171 are reduced before forming elements, for example, the TFT Tr or the color filter layer 175, there may be crack or brokenness. Accordingly, as mentioned above, after forming the elements on the first and second substrates 101 and 171, the etching process is performed to reduce the thickness of the first and second substrates 101 and 171. For example, the first and second substrates 101 and 171 may have a thickness of about 0.2 to 0.3 mm after the etching process.

Next, as shown in FIG. 8E, a liquid phase organic mixture including a solution, which includes an organic material such as PMMA and PET with an organic solvent and a carbon nano-tube is coated on an outer side of the second substrate 171, which having a reduced thickness, under a room temperature by a spin coating apparatus (not shown) or a slit coating apparatus (not shown) to form an organic solution layer 182. The organic material is inserted into the organic solvent to form the solution, and the power-type carbon nano-tube is inserted into the solution. The resulting solution is mixed to form liquid phase organic mixture.

Figure 8F:
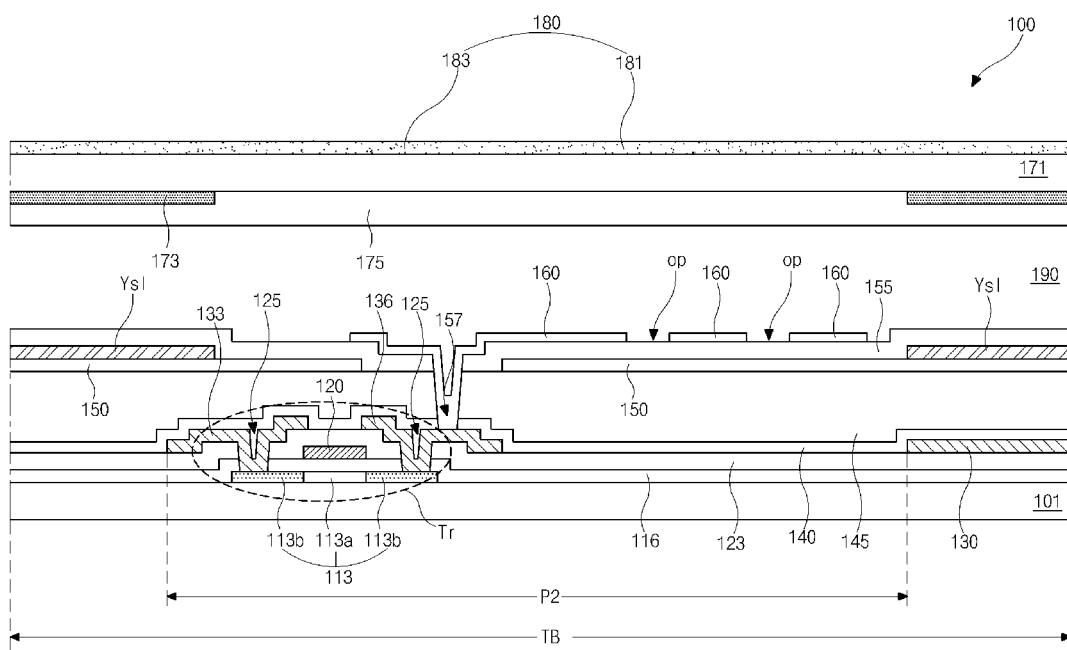

Next, as shown in FIG. 8F, the organic solution layer 182 (of FIG. 8E) including the carbon nano-tube is dried by heating in a furnace or oven (not shown) to volatilize the organic solvent. As a result, the anti-static layer 180 including the base layer 181 of the organic material and the carbon nano-tube 183 is formed on the outer side of the second substrate 171. As mentioned above, the anti-static layer 180 has a sheet resistance of about $10^6$ to $10^9$ ohms per square ($\Omega$/sq). For example, the anti-static layer 180 has a thickness of 300 to 1000 angstroms. The drying process may be performed under a temperature of 100° C., beneficially a temperature between about 50 to 80° C., to prevent a damage to the seal pattern by expansion of the liquid crystal layer 190 and a change of phase of the liquid crystal layer 190.

Although not shown, the X direction sensing circuit and the Y direction sensing circuit, which are respectively connected to the X direction sensing line and the Y direction sensing line, and a driving circuit connected to the gate line 119 and the data line 130 are formed on the liquid crystal panel to obtain the device 100.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A display device, comprising:
   a first substrate and a second substrate facing each other;
   a plurality of first electrodes and a plurality of second electrodes disposed between the first substrate and the second substrate;
   a third electrode disposed on at least one of the first substrate and the second substrate;
   a plurality of first conductive lines and a plurality of second conductive lines, one of the plurality of second conductive lines being electrically connected to one of the plurality of second electrodes;
   a plurality of third conductive lines extending along a direction different from a direction of the first conductive lines; and
   a thin film transistor including a semiconductor layer, a gate electrode, a source electrode, and a drain electrode,
   wherein the third electrode overlaps the plurality of first electrodes and the plurality of second electrodes in a plan view, wherein a sheet resistance of the third electrode is greater than a sheet resistance of the plurality of first electrodes and the plurality of second electrodes, wherein the plurality of second conductive lines extend along the plurality of first conductive lines, respectively, and wherein one of the first conductive lines is electrically connected to the source electrode, and one of the third conductive lines is electrically connected to the gate electrode.

2. The display device of claim 1, wherein a minimum distance between the plurality of first electrodes and the plurality of second electrodes is less than a minimum distance between the third electrode and the plurality of second electrodes.

3. The display device of claim 1, wherein the plurality of second electrodes include a plurality of first sub-electrodes and a plurality of second sub-electrodes, and wherein the display device is configured to be driven by a voltage of the plurality of first electrodes and the plurality of first sub-electrodes.

4. The display device of claim 3, wherein the plurality of first sub-electrodes group into a first touch block defining a first unit region for touch sensing, and the first touch block overlaps with at least one of the plurality of second conductive lines.

5. The display device of claim 4, wherein the plurality of second sub-electrodes group into a second touch block defining a second unit region for touch sensing.

6. The display device of claim 5, wherein the first touch block is separated from the second touch block.

7. The display device of claim 4, wherein the plurality of first sub-electrodes are arranged along the plurality of first conductive lines and are electrically connected by at least one of the plurality of second conductive lines.

8. The display device of claim 4, wherein the first touch block includes a plurality of pixel regions.

9. The display device of claim 3, wherein the plurality of first sub-electrodes is separated from the plurality of second sub-electrodes.

10. The display device of claim 1, wherein the third electrode serves as a conductive path for static electricity or an insulating layer for sensing a touch position.

11. The display device of claim 1, wherein the sheet resistance of the third electrode has a range of about $10^6$ to $10^9$ ohms per square ($\Omega$/sq).

12. The display device of claim 1, further comprising:
a liquid crystal layer between the first and second substrates,
wherein the plurality of first electrodes, the plurality of second electrodes, the plurality of first conductive lines, and the plurality of second conductive lines are disposed on the first substrate.

13. The display device of claim 12, wherein the third electrode is disposed on an outer side of the second substrate.

14. The display device of claim 1, wherein the plurality of first electrodes are disposed between the plurality of second electrodes and the third electrode.

15. The display device of claim 1, wherein the one of the plurality of second conductive lines is disposed on the one of the plurality of second electrodes.

* * * * *